(12) United States Patent
Doering et al.

(10) Patent No.: US 7,349,018 B2
(45) Date of Patent: Mar. 25, 2008

(54) CMOS IMAGE SENSOR AND METHOD FOR OPERATING A CMOS IMAGE SENSOR IN A WEAK INVERSION MODE WITH INCREASED DYNAMIC RANGE

(75) Inventors: Eiko Doering, Mörigen (CH); Joachim Grupp, Enges (CH)

(73) Assignee: Asulab S.A., Marin (CH)

( * ) Notice: Subject to any disclaimer, the term of this patent is extended or adjusted under 35 U.S.C. 154(b) by 606 days.

(21) Appl. No.: 10/479,721

(22) PCT Filed: May 31, 2002

(86) PCT No.: PCT/EP02/05980

§ 371 (c)(1), (2), (4) Date: May 10, 2004

(87) PCT Pub. No.: WO02/101832

PCT Pub. Date: Dec. 19, 2002

(65) Prior Publication Data

US 2004/0196398 A1    Oct. 7, 2004

(30) Foreign Application Priority Data

Jun. 8, 2001  (EP)  .................................. 01202211

(51) Int. Cl.
- H04N 3/14 (2006.01)
- H04N 5/335 (2006.01)
- H01L 27/00 (2006.01)

(52) U.S. Cl. ..................................... 348/308; 250/208.1
(58) Field of Classification Search ................ 348/302, 348/307, 308, 294, 296; 250/208.1
See application file for complete search history.

(56) References Cited

U.S. PATENT DOCUMENTS 4,973,833 A * 11/1990 Takada et al. ........... 250/208.1
(Continued)

FOREIGN PATENT DOCUMENTS

GB    2 359 355        8/2001
(Continued)

OTHER PUBLICATIONS

Loose et al.; "A Self-Calibrating Single-Chip CMOS Camera with Logarithmic Response"; Apr. 2001; IEEE Journal of Solid-State Circuits, vol. 36, No. 4; pp. 586-596.*

(Continued)

*Primary Examiner*—John M. Villecco
(74) *Attorney, Agent, or Firm*—Sughrue Mion, PLLC

(57) ABSTRACT

There is disclosed a CMOS technology image sensor and a method for operating such an image sensor. This sensor includes a plurality of pixels (50) each including a photo-sensor element (PD) producing charge carriers in proportion to its illumination and storage means (C1) capable of being coupled and uncoupled from the photo-sensor element at a determined instant in order to store, on a memory node (B) of the pixel, a measuring signal representative of the charge carriers produced by said photo-sensor element during an exposure phase.

Each pixel includes at least one MOS transistor (M1; M3) connected in series via its drain or source terminals to the photo-sensor element, and the transistor is configured such that it operates at least partially in weak inversion so that, during the exposure phase, the pixel has a logarithmic response for illumination levels higher than a determined illumination level.

This at least partially logarithmic response enables the pixel dynamic range to be increased.

19 Claims, 9 Drawing Sheets

U.S. PATENT DOCUMENTS

| | | | |
|---|---|---|---|
| 5,235,197 A | | 8/1993 | Washurak et al. |
| 5,241,575 A | * | 8/1993 | Miyatake et al. ............. 377/60 |
| 5,289,286 A | * | 2/1994 | Nakamura et al. .......... 257/292 |
| 6,133,563 A | | 10/2000 | Beiley et al. |
| 6,323,479 B1 | * | 11/2001 | Hynecek et al. ............ 348/308 |
| 6,355,965 B1 | * | 3/2002 | He et al. .................... 348/302 |
| 6,734,907 B1 | * | 5/2004 | Hagihara et al. ........... 348/308 |
| 6,831,691 B1 | * | 12/2004 | Takada et al. .............. 348/308 |
| 6,836,291 B1 | * | 12/2004 | Nakamura et al. .......... 348/308 |
| 6,867,409 B2 | * | 3/2005 | Kusuda et al. .............. 348/302 |
| 6,958,775 B1 | * | 10/2005 | Shinotsuka et al. ......... 348/302 |
| 6,967,682 B1 | * | 11/2005 | Hagihara .................... 348/308 |
| 6,999,122 B1 | * | 2/2006 | Hagihara et al. ........... 348/308 |
| 7,009,649 B2 | * | 3/2006 | Watanabe ................... 348/308 |
| 7,045,753 B1 | * | 5/2006 | Fox ............................ 348/308 |
| 2004/0227831 A1 | * | 11/2004 | Storm et al. ................ 348/294 |

FOREIGN PATENT DOCUMENTS

| | | | |
|---|---|---|---|
| JP | 11298798 A | * | 10/1999 |
| JP | 2001094878 A | * | 4/2001 |

OTHER PUBLICATIONS

Storm et al.; "Extended Dynamic Range From a Combined Linear-Logarithmic CMOS Image Sensor"; Sep. 2006; IEEE Journal of Solid-State Circuits; vol. 41, No. 9; pp. 2095-2106.*

Choubey et al.; "An Electronic Calibration Scheme for Logarithmic CMOS Pixels"; Aug. 2006; IEEE Sensors Journal; vol. 6, No. 4; pp. 950-956.*

Kavadias, S. et al: "A logarithmic response CMOS image sensor with on-chip calibration" IEEE Journal of Solid-State Circuits, Aug. 2000, IEEE, USA, vol. 345, No. 8, pp. 1146-1152, XP002187643.

Fox E C et al: "Wide-dynamic-range pixel with combined linear and logirthmic response and increased signal swing" Sensors and Camera Systems for Scientific Industrial, and Digital Photography Applications, San Jose, Ca, USA 24-26, Jan. 2000, vol. 3965, pp. 4-10, XP001058221 Proceedings of the SPIE - The International Society for the Optical Engineering, 2000, SPIE - Int. Soc. Opt. Eng. USA, ISSN: 0277-786X.

Guang Yang et al: "A snap-shot CMOS active pixel imager for low-noise, high-speed imaging" International Electron Devices Meeting 1998. Technical Digest (Cat. No. 98CH36217), International Electronic Devices Meeting 1997. Technical Digest, San Francisco, CA USA, 6-9 Dec. 1998, pp. 45-48, XP002187638 1998, Piscataway, NJ, USA, IEEE, USA ISBN: 0-7803-4774-9.

Orly Yadid-Pecht: "Wide-Dynamic-Range Sensors" Optical Engineering Soc. of Photo-Optical Instrumentation Engineers. Bellingham, US, vol. 38, No. 10, Oct. 1999 (1999-10), pp. 1650-1660, XP000859855, ISSN: 0091-3286, pp. 1653, col. 2, lines 10-30.

Orly Yadid-Pecht: "A Random Access Photodiode Array for Intelligent Image Capture", IEEE Transactions on Electron Devices, vol. 38, No. 8, Aug. 1991, pp. 1772-1780.

* cited by examiner

CMOS IMAGE SENSOR AND METHOD FOR OPERATING A CMOS IMAGE SENSOR IN A WEAK INVERSION MODE WITH INCREASED DYNAMIC RANGE

BACKGROUND OF THE INVENTION

The present invention generally concerns an integrated image sensor and a method for operating such an integrated image sensor. More particularly, the present invention concerns an integrated image sensor in CMOS technology with increased dynamic. Such CMOS image sensors are particularly intended for making integrated photographic and videos devices.

Owing to current integration technology, it is possible to make an operational image capturing device in integrated form. Such an integrated image capturing device incorporates, on the same chip, a photo-sensor component formed of a set of photo-sensor elements typically organised in the form of a matrix, and a processing component for assuring the operations of capturing images and reading the data captured by the photo-sensor component.

Traditionally, integrated image capturing devices rely on charge transfer techniques. According to these techniques, photo-generated charges are collected and transferred in a determined manner. The most common charge transfer techniques use CCD (charge-coupled device) components or CID (charge injection device) components. Although these devices utilising these components have found numerous commercial applications, they nonetheless have serious drawbacks. In particular, these components rely on non-standard manufacturing techniques, which are, in particular, incompatible with standard CMOS manufacturing processes. Such components are thus obstacles, in terms of costs and manufacturing ease, to the total integration of image sensors.

As a complement to the aforementioned techniques, a concept has been developed around the use of p-n semiconductor junctions as photo-sensor elements, these junctions being commonly called photodiodes. The essential advantage of such elements is their perfect compatibility with standard CMOS manufacturing processes. Solutions relying on photodiodes as photo-sensor elements are known from the prior art, in particular from the document "A Random Access Photodiode Array for Intelligent Image Capture" by Orly Yadid-Pecht, Ran Ginosar and Yosi Shacham Diamand, IEEE Transactions On Electron Devices, Vol. 38, no. 8, August 1991, pp. 1772-1780, incorporated by reference herein.

This document thus discloses an integrated image sensor in CMOS technology in the form of a single chip. The architecture of the sensor, which is similar to that of RAM memories, is illustrated in FIG. 1. This sensor, generally indicated by the reference numeral 1, includes a matrix 10 of pixels arranged in M lines and N columns. This matrix 10 occupies most of the surface of the sensor. A particular pixel of matrix 10 is read by addressing the corresponding line and column. For this purpose the sensor further includes a line addressing circuit 20 coupled to the lines of matrix 10 and an output bus 30 coupled to the columns of matrix 10, both controlled by a control circuit 40.

Each pixel of matrix 10 has a structure conforming to the illustration of FIG. 2a. The pixel, indicated generally by the reference numeral 50 in FIG. 2a, includes a photo-sensor element PD, a first stage A1, storage means C1 and a second stage A2, The photo-sensor element PD is formed of a reverse biased photodiode which typically operates by collecting the electrons photo-generated during a so-called integration period. First stage A1 is a sample and hold type circuit for sampling, at a determined time, the voltage value present across the terminals of photodiode PD. This sampled value is stored on storage means C1 which is typically formed of a capacitor. It will be noted that the voltage value stored on capacitor C1 depends on the transfer function of first stage A1 and in particular on the ratio between the value of the capacitance of photodiode PD and the capacitance of storage means C1. Second stage A2 enables the sampled voltage stored on storage means C1 to be read. The structure schematically described in FIG. 2a advantageously allows separation of the detection and reading processes.

The general structure of the pixel illustrated in FIG. 2a thus enables an electronic shutter function to be achieved, simultaneously allowing all the pixels of the sensor to be exposed and the signal representing this exposure to be stored in each pixel, for subsequent reading. By means of this structure, one can thus make an image sensor capable of taking snap-shots of a scene, i.e. a sensor perfectly suited to capturing images of objects which are moving with respect to the sensor.

Various embodiments are envisaged and presented in the aforementioned prior art document. FIG. 2b shows, in particular, one of these embodiments wherein pixel 50 includes reverse biased photodiode PD and five n-MOS type transistors M1 to M5. Each pixel 50 includes a memory node, designated B, formed of a capacitor (capacitance C1) and protected from the light, for example by a metal protective layer.

According to the aforementioned article, the pixel operates in an integration mode and transistor M1 initialises photodiode PD at a determined voltage before each integration period. Transistor M2 samples the charge accumulated by photodiode PD and stores the signal thereby sampled at the memory node B. Transistor M2 also ensures isolation or uncoupling of photodiode PD and memory node B. Transistor M3 initialises, in particular, memory node B at a determined voltage. Transistor M4 is a source follower transistor and transistor M5 is a line selection transistor and, during the read process, transfers voltage from transistor M4 to an output bus common to all the pixels in a column. The signals applied to this structure include a high supply voltage $V_{DD}$ and a low supply voltage $V_{SS}$ forming ground, a first initialisation signal TI, a coupling signal SH, a second initialisation signal RST, and a line selection signal RSEL.

A first terminal of photodiode PD is connected to ground $V_{SS}$ and the other terminal is connected to the source terminals of transistors M1 and M2 whose gate terminals are respectively controlled by signals TI and SH. The connection node between photodiode PD and the source terminals of transistors M1 and M2 will be designated by the reference A in the following description. The drain terminals of transistors M1, M3 and M4 are connected to the high supply voltage VDD. The second initialisation signal RST is applied to the gate terminal of transistor M3. The source terminal of transistor M3, the drain terminal of transistor M2 and the gate terminal of transistor M4 are together connected to memory node B of the pixel. The source terminal of transistor M4 is connected, via line selection transistor M5, to the output bus common to all the pixels in a column. The line selection signal RSEL is applied to the gate terminal of transistor M5.

It will be noted that most of the CMOS image sensors adopt a rolling shutter technique, i.e. exposure is effected line after line. Such non-simultaneous exposure inevitably leads to image distortion, in particular when a moving image is captured.

The structure of the pixel illustrated in FIGS. 2a and 2b is typically operated in accordance with an integration mode, i.e. the photo-sensor elements are all first of all initialised at a determined voltage and then subjected to illumination during a determined period of time, the charges produced by the photo-sensor elements being accumulated or integrated during this period. According to this operating mode, the pixel response can be termed linear. One drawback of this operating mode lies in the fact that the pixel dynamic range is reduced.

Numerous applications require wide dynamic range image sensors. In order to increase the dynamic range of an image sensor, using sensors including pixels with a logarithmic type response is already known. FIG. 3 shows a diagram of such a pixel arranged to have a logarithmic response. This pixel, globally indicated by the reference numeral 50, includes a reverse biased photodiode PD, and a first and second n-MOS type transistor Q1 and Q2. A first terminal of photodiode PD is connected to ground $V_{SS}$ and its other terminal is connected to the source terminal of transistor Q1. The gate and drain terminals of transistor Q1 are together connected to a supply potential VDD. In this configuration, a low intensity current (of the order of fA to nA), generated by photodiode PD passes through transistor Q1, which is connected as a resistor, and consequently operates in weak inversion or subthreshold conduction. The voltage $V_{OS}$ at the terminals of photodiode PD, at the connection node between photodiode PD and transistor Q1, consequently has logarithmic dependence with respect to the current generated via the effect of illumination. Transistor Q2 forms a pixel read stage (similar to transistor M4 of FIG. 2b) and its gate terminal is connected to the connection node between photodiode PD and transistor Q1.

The configuration illustrated in FIG. 3 is called a continuous conversion configuration, i.e. the voltage $V_{OS}$, which is a logarithmic function of the current generated by photodiode PD, is directly converted and is representative of the pixel illumination. Unlike the linear response pixel structures, the charges produced by the photo-sensor element are not "integrated" during a so-called integration or period or exposure of determined duration.

One problem of the configuration illustrated in FIG. 3 lies in the fact that the voltage variation produced as a function of illumination tends to be relatively low (of the order of several hundreds of mV). This makes the use of such a pixel difficult for implementing a sensor with a high signal over noise ratio, in particular for reduced illumination levels. Further, the response time of this type of pixel becomes very long for low illuminations where the photo-generated current is low.

Thus the document entitled "Wide-Dynamic-Range Pixel With Combined Linear and Logarithmic Response and Increased Signal Swing", Eric C. Fox et al., Sensors and Camera Systems for Scientific, Industrial and Digital Photography Applications, Proceedings of SPIE Vol. 3965 (2000), pp. 4-10, has also proposed a pixel structure having a combined linear-logarithmic response. A diagram of this pixel is shown in FIG. 4.

Unlike the pixel of FIG. 3, this pixel further includes a third transistor Q3 connected via its source terminal to the connection node between photodiode PD and first transistor Q1 and, via its drain terminal, to a so-called initialisation or reset potential $V_{BIAS}$. The conduction state of transistor Q3 is controlled by the signal $\Phi_{RST}$ applied to its gate terminal.

The initialisation potential $V_{BIAS}$ is higher than supply voltage $V_{DD}$ so that when signal $\Phi_{RST}$ is at the high logic state, the voltage $V_{OS}$ at the terminals of photodiode PD is brought to a voltage such that the gate-source voltage of transistor Q1 is less than the voltage necessary to allow subthreshold conduction of transistor Q1.

As soon as signal $\Phi_{RST}$ is returned to a low logic level, voltage $V_{OS}$ decreases linearly via the effect of illumination until the gate-source voltage of transistor Q1 reaches a level such that the transistor operates in weak inversion. Beyond this level, the pixel response becomes logarithmic in a similar way to that mentioned already with reference to FIG. 3.

Like the structure illustrated in FIG. 3, the voltage VOS at the terminals of photodiode PD is directly applied to the input of the read stage. It is thus not possible to use these structures directly to make an electronic shutter image sensor suitable for taking snap-shots.

SUMMARY OF THE INVENTION

One object of the present invention is thus to propose a method for operating an electronic shutter image sensor of the aforementioned type having a pixel structure according to the illustrations of FIGS. 2a and 2b with increased dynamic range.

In order to answer this object, the present invention concerns a method for operating a CMOS image sensor.

The present invention also concerns a CMOS image sensor.

Advantageous embodiments of the present invention form the subject of the dependent claims.

According to certain particular embodiments of the invention, there are thus proposed an image sensor and various methods for operating such an electronic shutter image sensor such that each pixel has a combined linear-logarithmic response.

According to another particularly advantageous embodiment, there is proposed an image sensor and a method for operating such an electronic shutter image sensor such that each pixel has a combined linear-logarithmic response and increased sensitivity.

An advantage of the present invention lies in the fact that the dynamic range of such an electronic shutter image sensor, in particular, utilising a pixel structure like the structure illustrated in FIG. 2b, is increased.

BRIEF DESCRIPTION OF THE DRAWINGS

Other features and advantages of the present invention will appear more clearly upon reading the following detailed description, made with reference to the annexed drawings, which are given by way of non-limiting example and in which:

FIG. 9b shows the potential levels generated by the voltages applied to the gates of the transistors of the structure of FIG. 2b operated in accordance with the eighth variant illustrated in FIG. 9a.

DESCRIPTION OF PREFERRED EMBODIMENTS

Various variants of the method according to the invention for operating pixel 50 of FIG. 2b such that it has a logarithmic response for illumination levels higher than a determined illumination level, will now be described with reference to the Figures.

Figure 1:
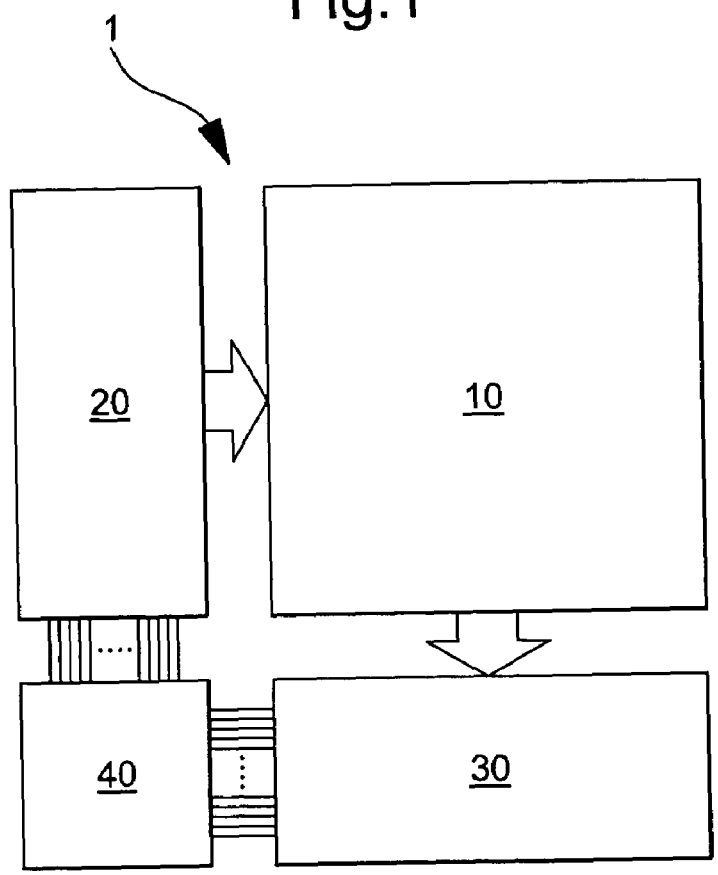
FIG. 1, which has already been presented, illustrates schematically the conventional architecture of a CMOS image sensor.
Figure 2A:
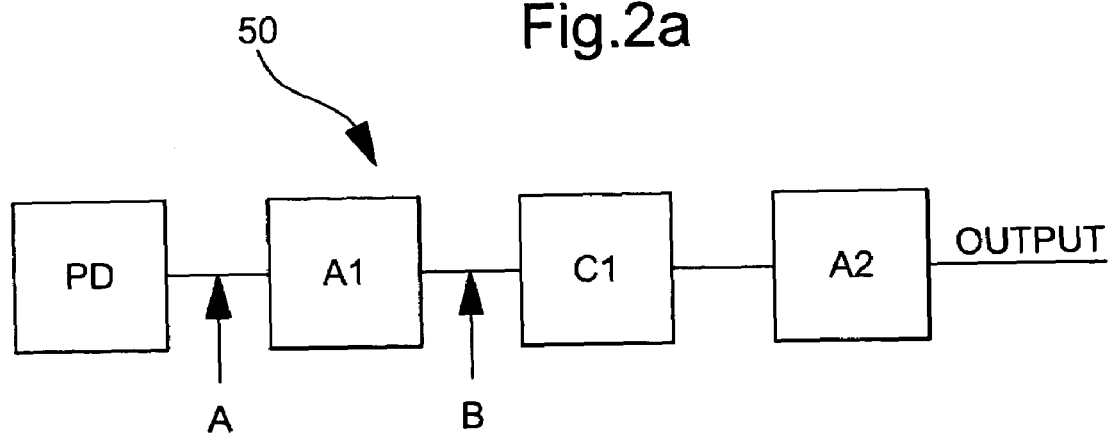
FIGS. 2a and 2b, which have already been presented, illustrate respectively a basic diagram and a detailed diagram of a known pixel structure of the CMOS image sensor of FIG. 1.
Figure 2B:
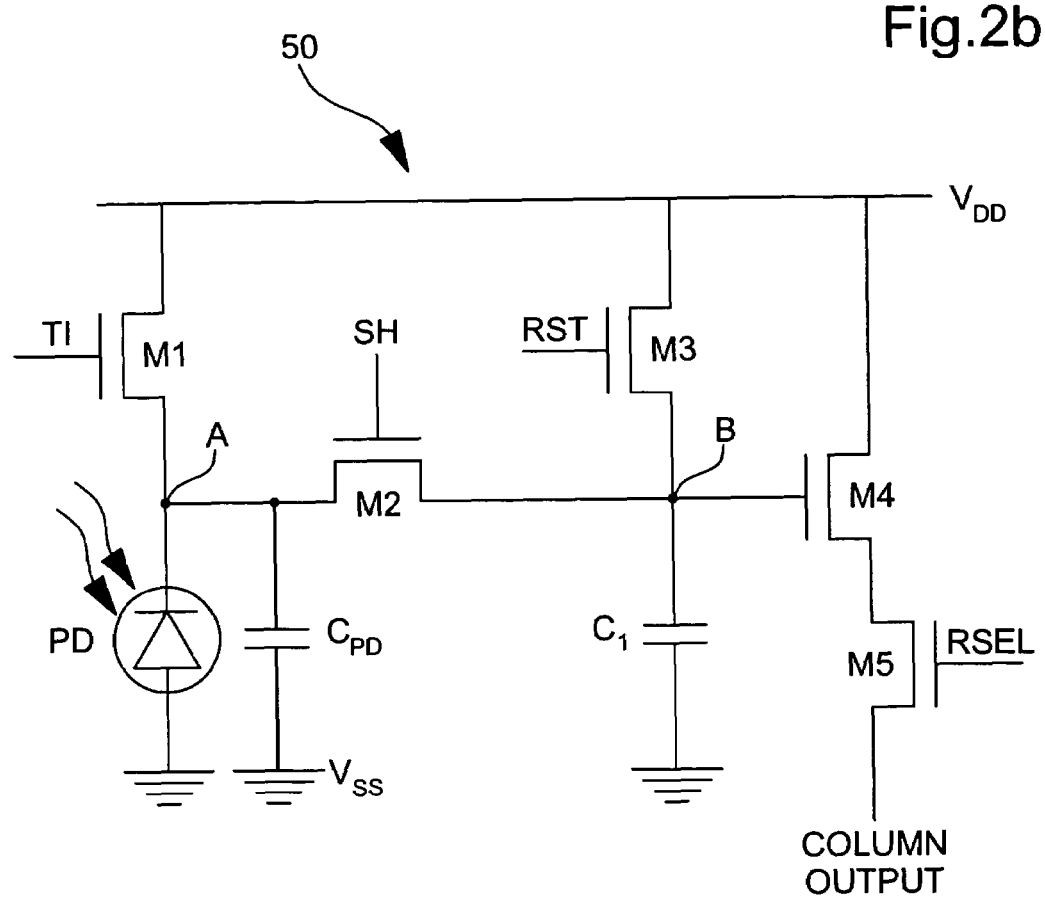

It will be understood that the various variants of the method according to the present invention are not limited to operating a structure like the structure illustrated in FIG. 2b, but can also be applied in a similar manner to any type of structure which schematically takes the form of the structure of FIG. 2a, i.e. a structure including a photo-sensor element and storage means capable of being coupled to the photo-sensor element at a determined instant in order to produce and store a measuring signal representative of the charge carriers produced by the photo-sensor elements during exposure, this structure having at least one MOS transistor connected (directly or indirectly) via its drain or source terminal to the photo-sensor element. The structure of FIG. 2b nonetheless constitutes a simple and particularly advantageous structure. In this regard, it will be noted that transistor M1 or transistor M3 can be configured to operate in weak inversion mode, transistor M1 being directly connected to photodiode PD whereas transistor M3 is connected to photodiode PD via coupling transistor M2. It will be seen that this possibility of using transistor M1 or M3 independently assures great flexibility of use.

Figure 5A:
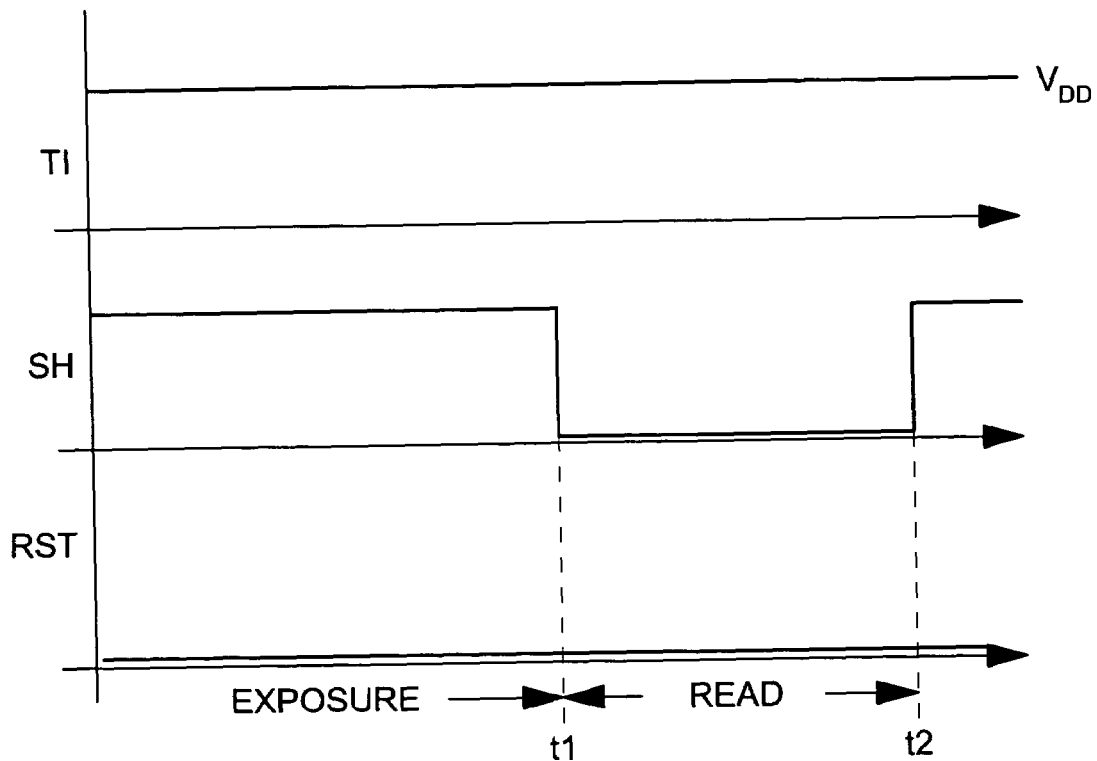
FIGS. 5a to 5c shows diagrams illustrating first, second and third variants of the method according to the invention for operating the structure of FIG. 2b such that it has, in addition to the electronic shutter function, a logarithmic type response.

FIG. 5a thus shows a temporal diagram of the evolution of control signals TI, SH and RST applied respectively to transistors M1, M2 and M3 of the pixel structure of FIG. 2b illustrating a first variant of the method according to the invention. According to this first variant, transistor M1 is connected in a resistor configuration, the gate terminal of this transistor M1 being continuously connected to supply voltage $V_{DD}$. The signal TI is thus kept at a voltage value applied to the drain of transistor M1. According to this first variant, the coupling signal SH is held at the high logic state so as to couple memory node B to the source terminal of transistor M1 (node A) during exposure. The voltage present at memory node B is thus representative of the voltage present at node A at the terminals of photodiode PD. The signal RST applied to the gate of transistor M3 is held here continuously at a low logic level so as to make transistor M3 non-conductive and thus uncouple memory node B from supply voltage $V_{DD}$.

Figure 3:
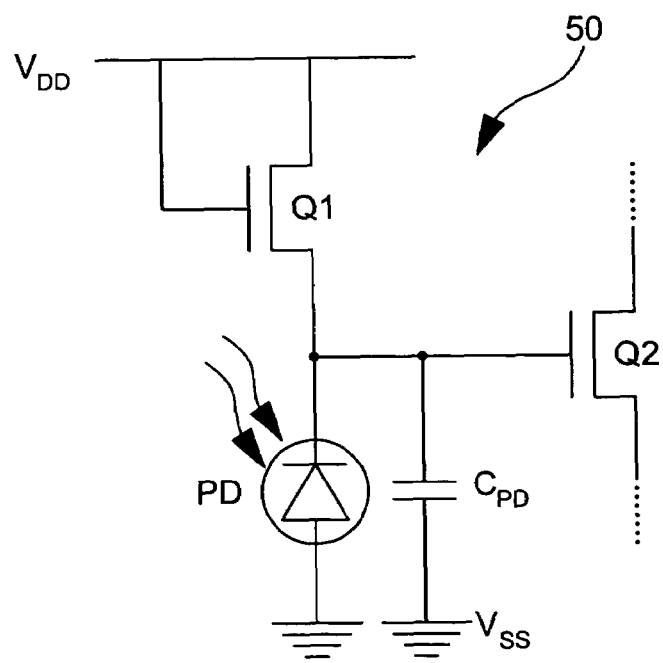
FIG. 3, which has already been presented, shows a detailed diagram of a known logarithmic response pixel structure.
Figure 4:
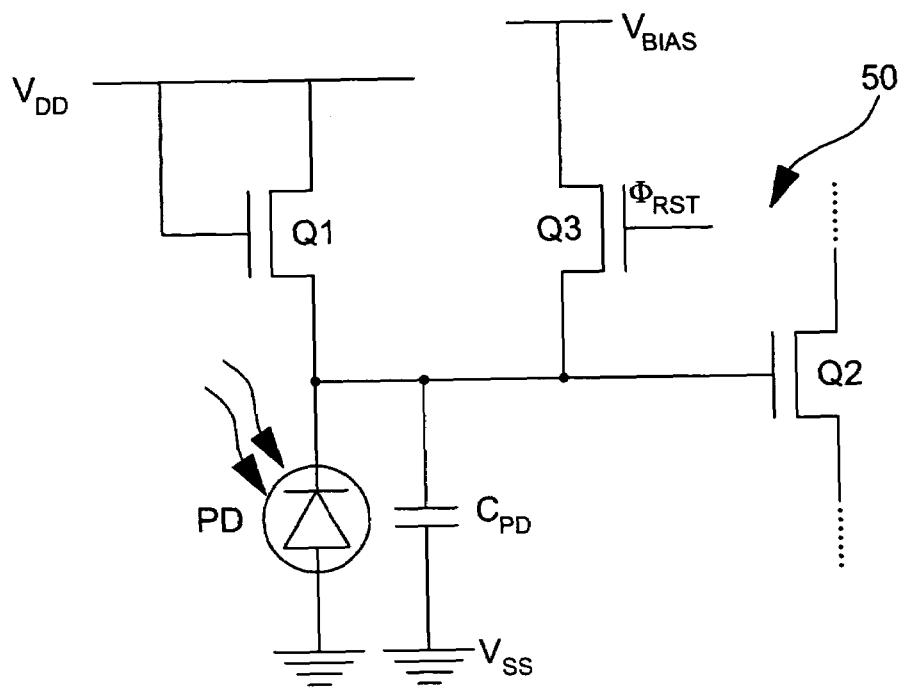
FIG. 4, which has already been presented, shows a detailed diagram of a known combined linear-logarithmic response pixel structure.

During exposure, the pixel thus behaves in a similar manner to the structure illustrated in FIG. 3, i.e. transistor M1 behaves like a high impedance resistor through which the current generated by photodiode PD passes. Since the generated current is of the order of fA to nA, transistor M1 operates in weak inversion mode the response of the pixel is thus also logarithmic.

Exposure is extended until the stage (instant t1) when the signal SH is brought to a low level thus uncoupling memory node B from photodiode PD, the measuring signal then being stored on storage capacitor C1. The read operation can then be undertaken by means of transistors M4 and M5. A new exposure phase begins by signal SH passing again to its high level (instant t2).

Figure 5B:
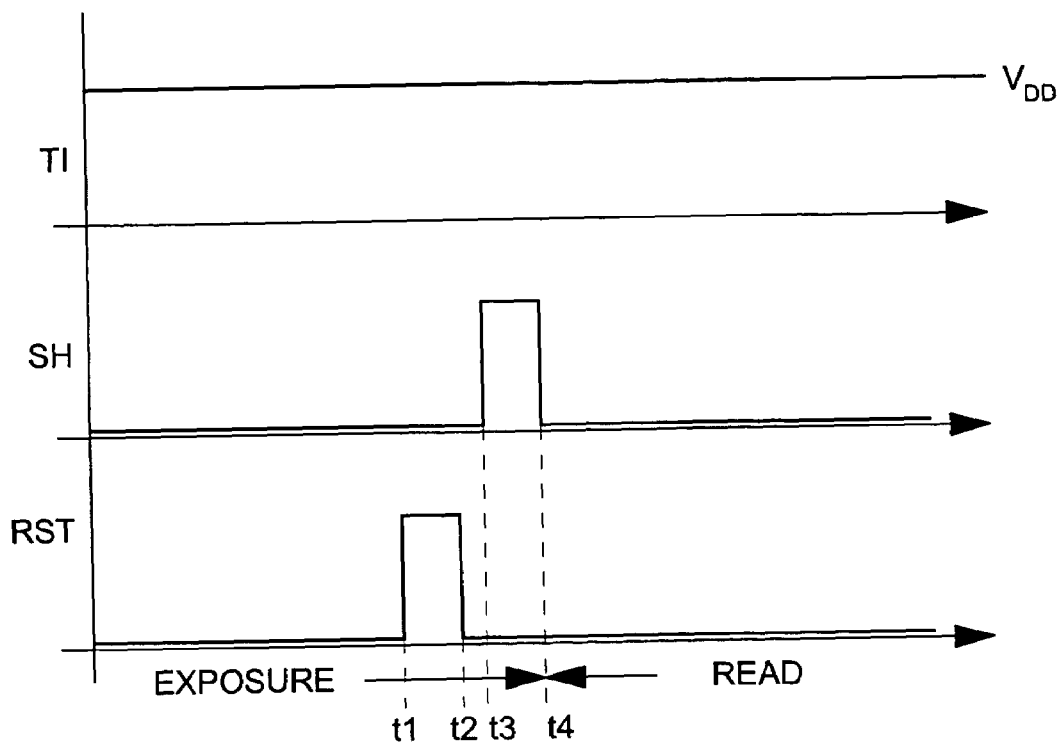

FIG. 5b shows a temporal diagram of the evolution of control signals TI, SH and RST applied to the pixel structure of FIG. 2b illustrating a second variant of the method according to the invention for operating the pixel such that it has a logarithmic response. According to this second variant, transistor M1 is also connected in a resistor configuration, the gate terminal of transistor M1 being connected to supply voltage $V_{DD}$. Signal TI is thus held continuously at the voltage value applied to the drain of transistor M1. Coupling signal SH is held here at the low logic state so as to uncouple memory node B from the source terminal of transistor M1 (node A) during exposure. As illustrated in the diagram of FIG. 5b, signal SH is briefly pulsed at the high logic state (instants t3 to t4) so as to sample and store the measuring signal on memory node B. Before signal SH passes to the high state, signal RST applied to transistor M3 is also briefly pulsed at the high logic state (instants t1 to t2) so as to initialise memory node B at a determined initialisation voltage.

Unlike the variant illustrated in FIG. 5a, the read operation according to this second variant can be undertaken in parallel to a subsequent exposure, as soon as the memory signal has been stored on memory node B.

Figure 5C:
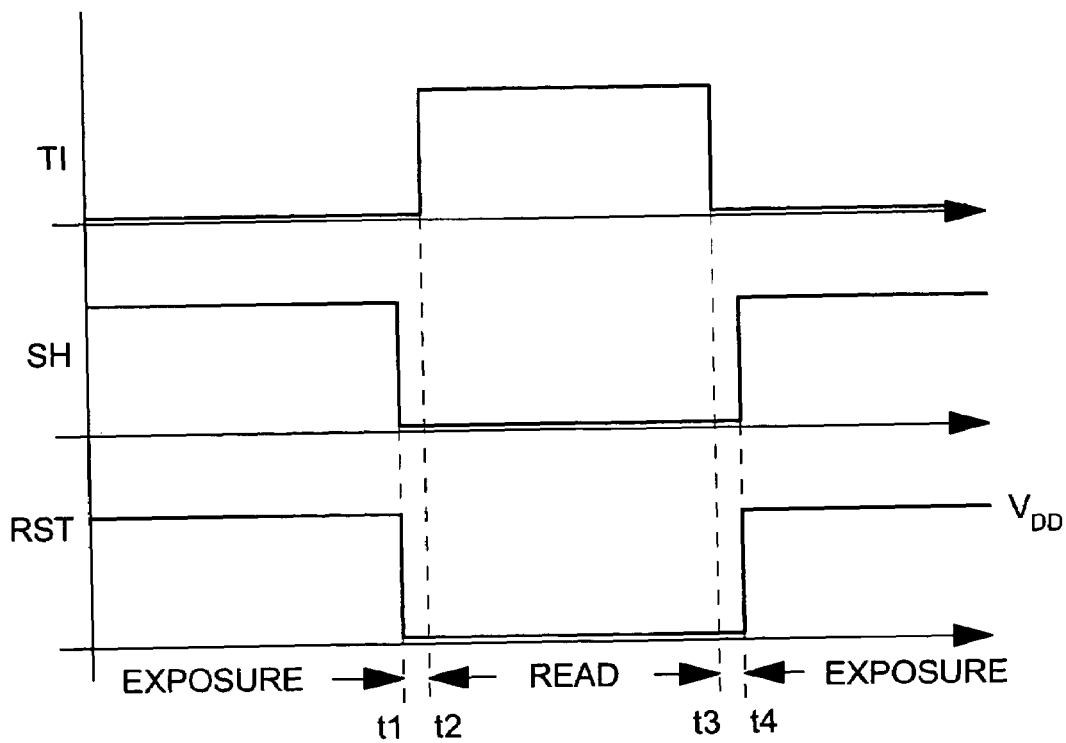

FIG. 5c shows a temporal diagram of the evolution of control signals TI, SH and RST applied to the pixel structure of FIG. 2b illustrating a third variant of the method according to the invention also for operating the pixel such that it has a logarithmic response. According to this third variant, and unlike the preceding variants, transistor M3 is connected in a resistor configuration during exposure, the gate terminal of transistor M3 being connected to supply voltage $V_{DD}$. Signal RST is thus kept, during the exposure phase, at the voltage value applied to the drain of transistor M3. Coupling signal SH is kept at the high logic state so as to couple memory node B to the source terminal of transistor M1 (node A) during exposure. Signal TI is kept at the low logic level during exposure.

The exposure is extended until instant t1 when coupling signal SH and signal RST are brought to a low level in order to isolate memory node B and store the measuring signal on this node. Ideally, signals SH and RST should be simultaneously brought to the low level at instant t1. Given that the simultaneous switching of transistors M2 and M3 is difficult to achieve in practice, signal RST will preferably be made to pass first of all to the low level followed by signal SH. This would induce a slight offset at the measuring signal present on memory node B which could be considered and tolerated during reading.

Moreover, signal TI applied to the gate terminal of transistor M1 should preferably be made to pass to a high level as soon as the measuring signal has been stored on memory node B (instant t2 in FIG. 5c). In fact, since photodiode PD is uncoupled, it continues to produce charge carriers which could disturb the signal present on memory node B. Operated in this way, transistor M1 thus allows the charge carriers produced by photodiode PD to be drained.

From instant t2, the read operation can be undertaken by means of transistors M4 and M5. At the end of the read operation, signal TI is returned to its low level (instant t3) then signals SH and RST are returned to the preceding levels for the next exposure.

Figure 6A:
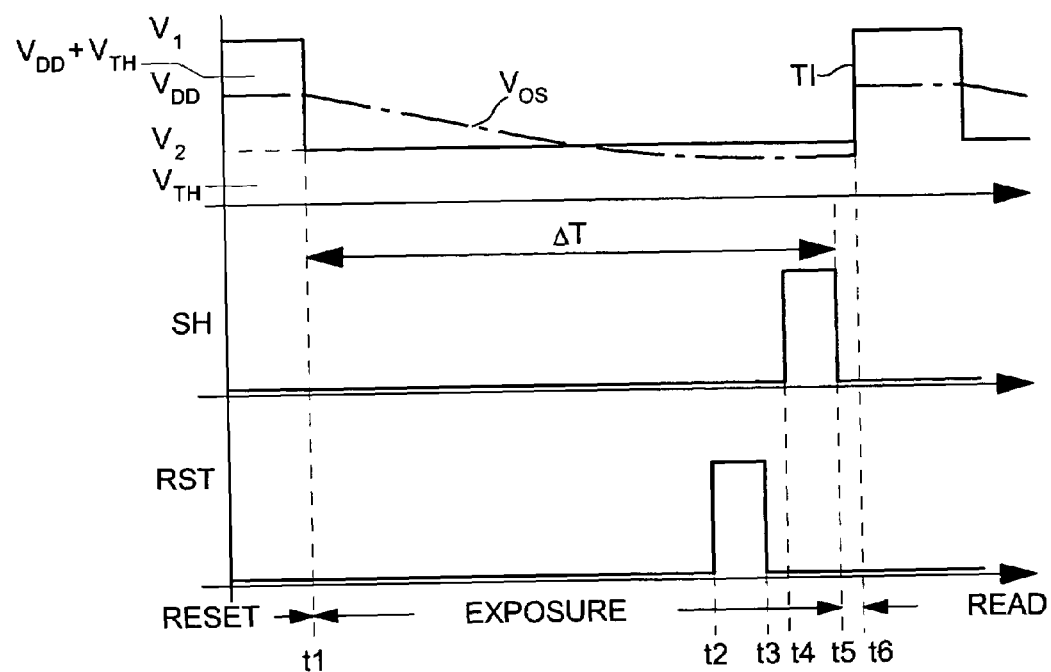
FIGS. 6a and 6b show diagrams illustrating fourth and fifth variants of the method according to the invention for operating the structure of FIG. 2b such that it has, in addition to the electronic shutter function, a combined linear-logarithmic response.
Figure 6B:
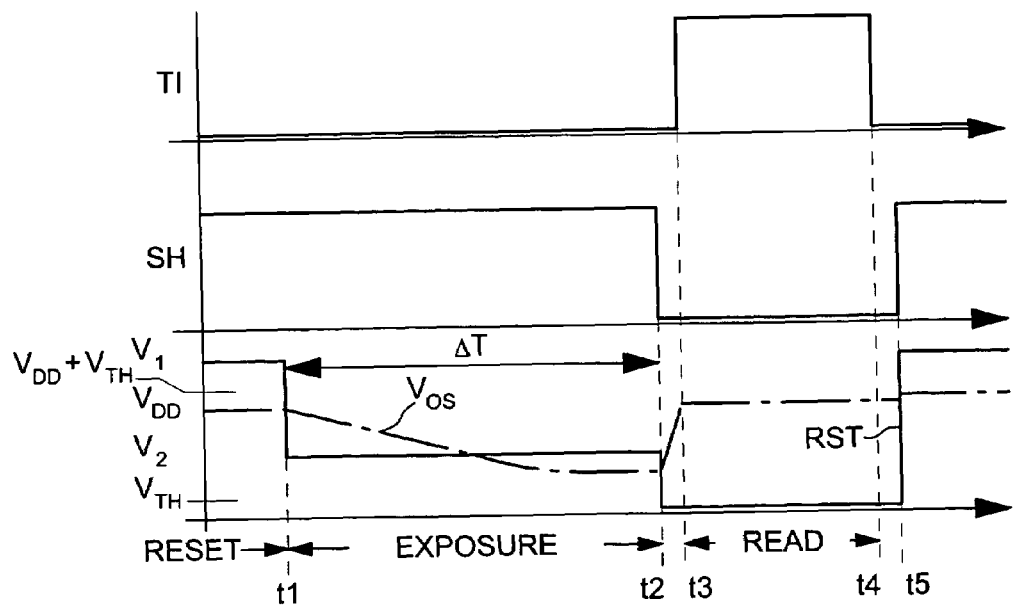

The variants, which will now be presented with reference to FIGS. 6a and 6b, constitute advantageous variants enabling the structure illustrated in FIG. 2b to be operated such that it has a combined linear-logarithmic response.

FIG. 6a thus presents a fourth variant of the method according to the present invention according to which transistor M1 is configured such that it operates at least partially in weak inversion so that, during the exposure phase of the photo-sensor element, the pixel has a logarithmic response for illumination levels higher than a determined illumination level.

As illustrated in the diagram of FIG. 6a, the signal TI applied to the gate terminal of transistor M1 is switched between a first analog level, designated $V_1$, higher than supply voltage $V_{DD}$ plus the threshold voltage, designated $V_{TH}$, of transistor M1, and a second analog level, designated $V_2$, lower than or equal to supply voltage $V_{DD}$ but higher than threshold voltage $V_{TH}$ of transistor M1. The first analog level $V_1$ is applied during an initialisation phase forcing the voltage at the terminals of photodiode PD to voltage $V_{DD}$. The second analog level $V_2$ is applied for a determined period $\Delta T$ (instants t1 to t5) during the exposure phase. According to this variant, pixel nodes A and B are uncoupled during the exposure phase (and during the initialisation phase); signal SH being thus kept at a low logic level. This signal SH is briefly pulsed at a high level at the end of the exposure phase (instants t4 to t5) in order to sample and store the measuring signal on memory node B. Before the passage of signal SH to the high state, signal RST which is applied to transistor M3 is also briefly pulsed at the high logic state (instants t2 to t3) so as to initialise memory node B at a determined initialisation voltage. The read operation is undertaken in parallel with a subsequent exposure, as soon as the measuring signal has been stored on memory node B.

According to this fourth variant of the invention, as soon as the signal TI is brought from its first to its second analog state (instant t1), photodiode PD is first of all released from its initialisation voltage $V_{DD}$. At this instant, the gate-source voltage of transistor M1 is such that the transistor is not conductive. The pixel response is thus of the linear type and voltage $V_{OS}$ at the terminals of photodiode PD decreases linearly with a slope dependent upon the pixel illumination. If the illumination is such that voltage $V_{OS}$ decreases and becomes lower than the voltage applied to the gate terminal of transistor M1, namely second analog level $V_2$ of signal TI, transistor M1 enters weak inversion mode and the pixel response thus becomes of the logarithmic type. In a way, a signal compression operation is performed on the pixel.

FIG. 6b shows a fifth variant of the method according to the present invention, similar to the variant illustrated in FIG. 6a but according to which transistor M3 is configured such that it operates at least partially in weak inversion so that, during the photo-sensor exposure phase, the pixel has a logarithmic response for illumination levels higher than a determined illumination level.

As illustrated in the diagram of FIG. 6b, the two analog levels $V_1$ and $V_2$ are applied to the gate terminal of transistor M3 respectively during an initialisation phase and during an exposure phase for a determined period of time $\Delta t$ (instants t1 to t2). According to this variant, pixel nodes A and B are coupled during the exposure phase, signal SH being thus kept at a high logic level during this phase. This signal SH is brought to a low logic level (as is signal RST) at the end of the exposure phase (instants t2 to t5) in order to isolate memory node B and to store the measuring signal on memory node B.

Moreover, signal TI applied to the gate terminal of transistor M1 is preferably brought to a high level (at least higher than the voltage applied to the gate of transistor M2) as soon as the measuring signal has been stored on memory node B (instant t3 in FIG. 6b) allowing drainage, via transistor M1, of the charge carriers produced by photodiode PD.

From instant t3, the read operation can be undertaken by means of transistors M4 and M5. At the end of the read operation, signal TI is returned to its low level (instant t4) then signals SH and RST are returned to the preceding levels for the next exposure as illustrated.

In a similar way to the variant of FIG. 6a, according to this fifth variant of the invention, as soon as signal RST is brought from its first to its second analog level (instant t1), photodiode PD is first of all released from its initialisation voltage substantially equal to $V_{DD}$. At this instant, the gate-source voltage of transistor M3 is such that the transistor is not conductive. The pixel response is thus of the linear type and voltage $V_{OS}$ at the terminals of photodiode PD decreases linearly with a slope dependent upon the pixel illumination, the voltage present on memory node B being representative of voltage $V_{OS}$. If the illumination is such that the voltage at memory node B decreases and becomes lower than the voltage applied to the gate terminal of transistor M3, namely the second analog level $V_2$ of signal RST, transistor M3 enters a weak inversion mode and the pixel response then becomes of the logarithmic type, a signal compression operation is thus performed on the pixel.

Figure 7A:
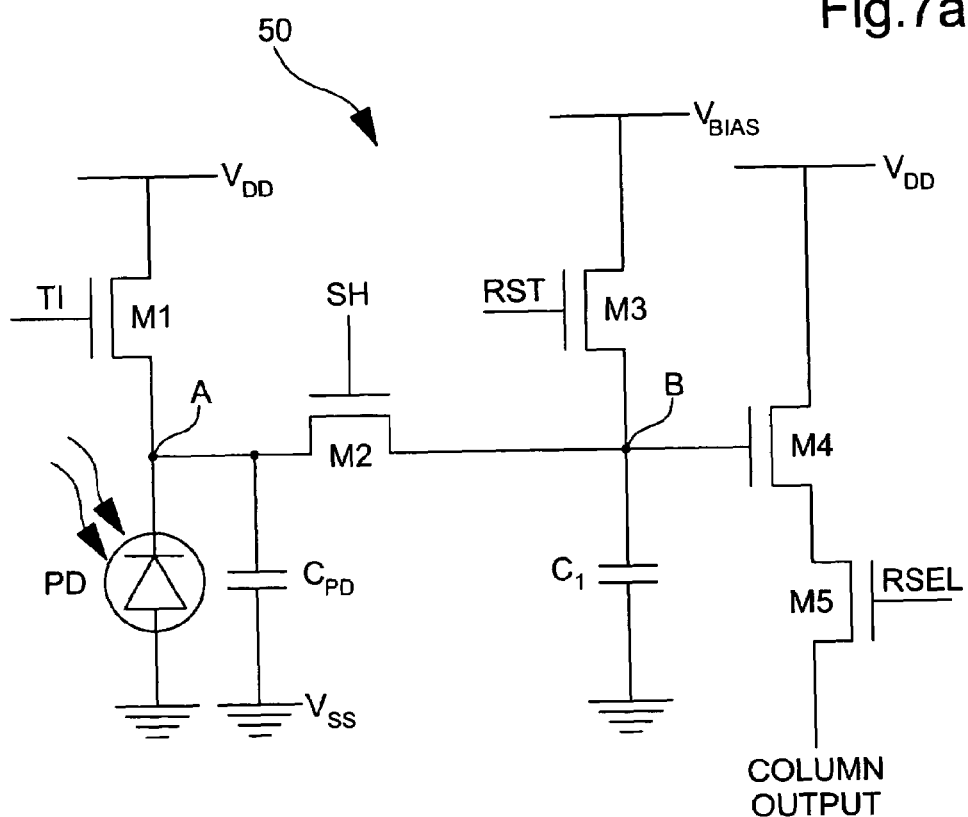
FIGS. 7a and 7b illustrate first and second variants of the pixel structure of FIG. 2b able to be operated such that they have a combined linear-logarithmic response.
Figure 7B:
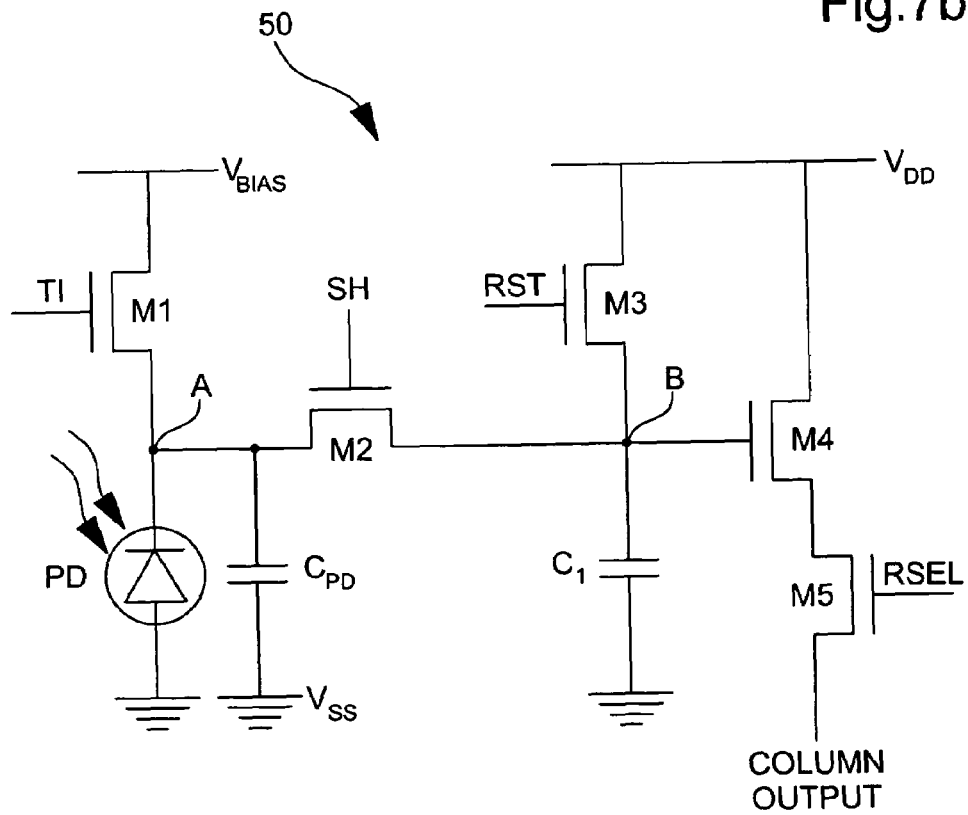

A variant of the principles of FIGS. 6a and 6b can consist in not switching the voltage applied to the gate terminal of transistor M1 or M3, but in switching the voltage applied to the drain of said transistors. FIGS. 7a and 7b thus illustrate first and second variants of the pixel structure of FIG. 2b able to be operated such that they have a combined linear-logarithmic response.

The structure of FIG. 7a differs in particular from the structure of FIG. 2b in that the drain terminal of transistor M3 is connected to a supply potential $V_{BIAS}$ higher than supply potential $V_{DD}$. The structure of FIG. 7b differs from the structure of FIG. 2b in particular in that the drain terminal of transistor M1 is connected to supply potential $V_{BIAS}$.

Figure 8A:
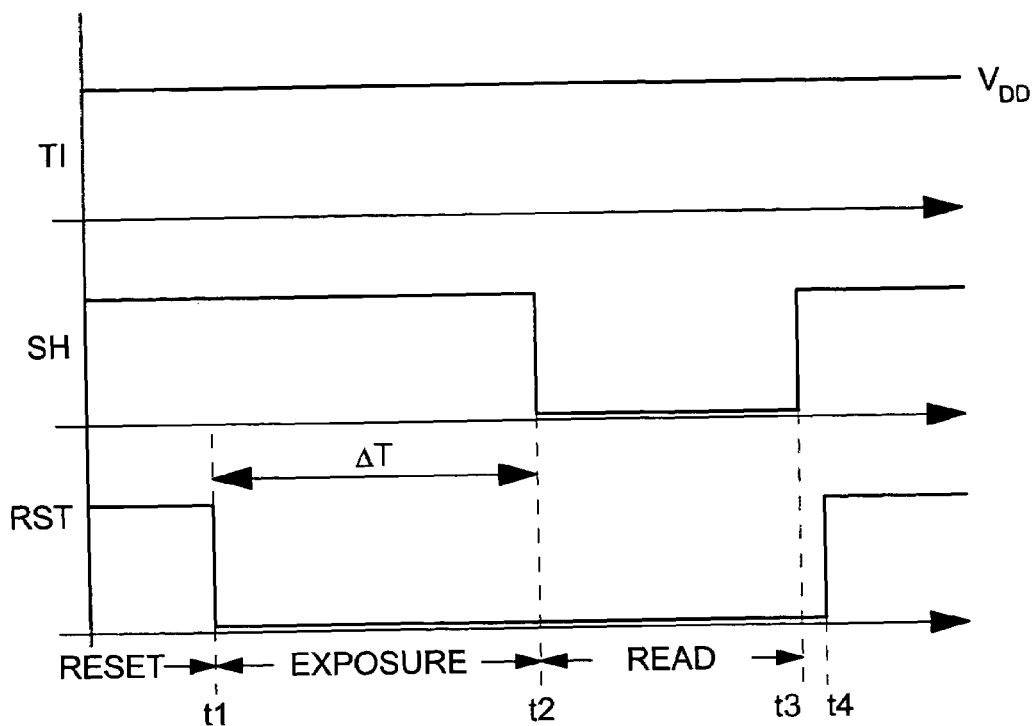
FIGS. 8a and 8b show diagrams illustrating sixth and seventh variants of the method according to the invention respectively for operating the pixel structures of FIGS. 7a and 7b such that they have a combined linear-logarithmic response.

The diagram of FIG. 8a illustrates the evolution of signals TI, SH and RST applied to the pixel structure of FIG. 7a. In a similar way to the variant of FIG. 5a, transistor M1 is continuously connected in a resistor configuration, the gate terminal of this transistor M1 being connected to supply voltage $V_{DD}$. During a first initialisation phase (until instant t1), signal RST is brought to its high logic level so as to apply a determined initialisation voltage higher than supply voltage $V_{DD}$ to the source terminal of transistor M1. During this initialisation stage, and during the pixel exposure phase, signal SH is held at a high logic level so as to couple pixel nodes A and B. Nodes A and B are thus both initialised by means of transistor M3.

The exposure phase begins by the passage of signal RST to the low logic level (instant t1) and continues until the moment (instant t2) when signal SH is brought to a low logic level in order to insulate memory node B and thus store the measuring signal on memory node B. During this exposure step, the pixel has a linear response as a function of the illumination and, as soon voltage $V_{OS}$ at the terminals of photodiode PD becomes lower than the gate voltage of transistor M1 (namely voltage $V_{DD}$), transistor M1 enters weak inversion mode and the pixel then has a logarithmic response.

At instant t2, the measuring signal is thus stored on memory node B and the read process can then begin using transistors M4 and M5. In this case, the charge carriers produced by photodiode PD are drained via transistor M1, voltage $V_{OS}$ being held at its equilibrium level defined by the current generated by photodiode PD.

At the end of the read process (instant t3), signal SH is returned to its preceding high logic level, followed (instant t4) by initialisation signal RST. The whole process is then repeated for the next acquisition.

Figure 8B:
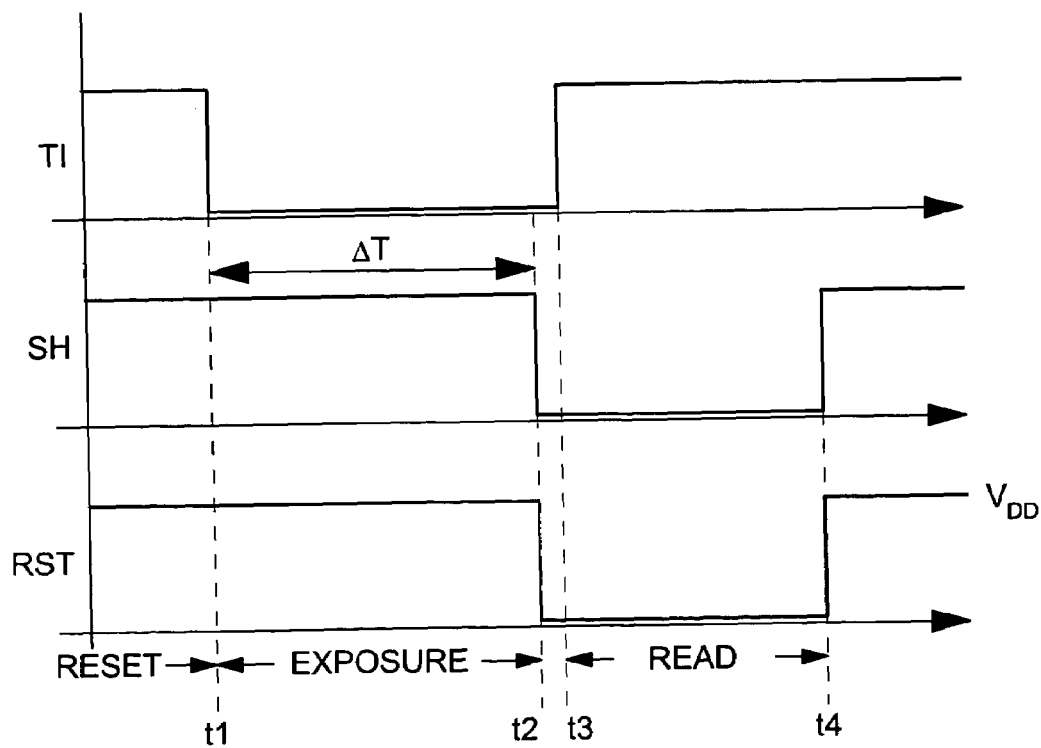

The diagram of FIG. 8b illustrates the evolution of signals TI, SH and RST applied to the pixel structure of FIG. 7b. In a similar way to the variant of FIG. 5c, transistor M3 is connected in a resistor configuration during the exposure phase, the gate terminal of transistor M3 being connected to supply voltage $V_{DD}$. During a first initialisation phase (until instant t1), signal TI is brought to its high logic level so as to apply, to the source terminal of transistor M3 (at memory node B), a determined initialisation voltage higher than supply voltage $V_{DD}$. During this initialisation step, signal SH is kept at a high logic level so as to couple nodes A and B. Nodes A and B are thus both initialised by means of transistor M1.

The exposure phase begins by signal TI passing to the low logic level (instant t1) and continues until the moment (instant t2) when signals SH and RST are brought to a low logic level in order to isolate memory node B and thus store the measuring signal on memory node B. During this exposure step, the pixel has a linear response as a function of illumination and, as soon as the voltage of memory node B becomes lower than the gate voltage of transistor M3 (namely voltage $V_{DD}$), the transistor enters weak inversion mode and the pixel then has a logarithmic response.

At instant t2, the measuring signal is thus stored on memory node B and the read process can then begin using transistors M4 and M5. Preferably, as soon as the measuring signal is stored on memory node B, it is advantageous to return signal TI to the high logic level (instant t3) in order to drain the charge carriers, which are continuously produced by photodiode PD via transistor M1.

At the end of the read process (instant t4), signals SH and RST are returned to their preceding level and the whole process is repeated for the next acquisition.

A particularly advantageous variant of the method according to the present invention will now be described with reference to FIGS. 9a and 9b. In addition to the electronic shutter function and the increased pixel dynamic range, this variant also allows the sensitivity of the pixel to be increased.

To a certain extent, this variant is similar to the variant illustrated in FIG. 6b, the only difference being that transistor M2 is no longer operated as a switch in order to couple and uncouple pixel nodes A and B. According to this variant, signal SH is brought, preferably continuously, to an intermediate logic level designated $V_{INT}$, i.e. a level located between the logic levels normally applied to switch transistor M2. As will be seen in detail hereinafter, this analogue level $V_{INT}$ is selected to be lower than analog level $V_2$ applied to transistor M3 during exposure.

Figure 9A:
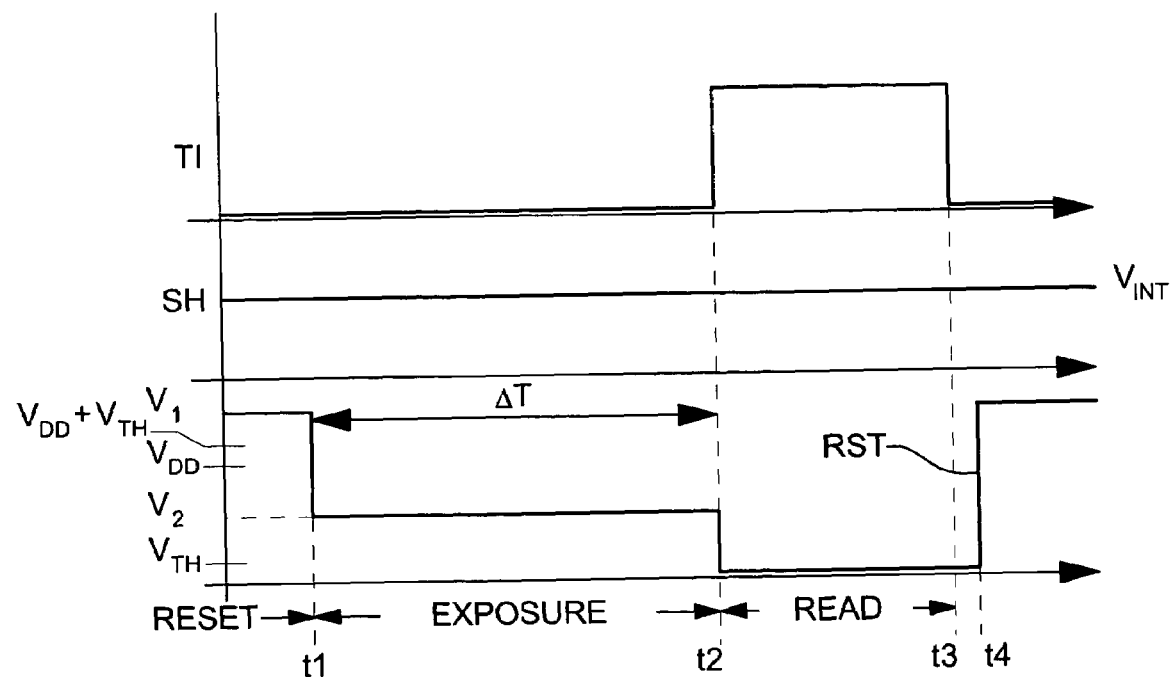
FIG. 9a shows a diagram illustrating an eighth particularly advantageous variant of the method according to the invention for operating the structure of FIG. 2b such that it has, in addition to the electronic shutter function, a combined linear-logarithmic response and increased sensitivity.

As regards the rest, signals TI and RST are operated in an essentially similar manner to the variant of FIG. 6b, as illustrated in the diagram of FIG. 9a. In a first initialisation phase, signal RST is brought to its first analog level $V_1$ higher than supply voltage $V_{DD}$ plus threshold voltage $V_{TH}$ of transistor M3, signal TI being kept at the low logic state during this phase. Photodiode PD is initialised via transistor M3 and transistor M2 at a voltage substantially equal to the gate voltage of transistor M2, i.e. $V_{INT}$, less threshold voltage $V_{TH}$ of transistor M2.

The exposure begins by signal RST passing (instant t1) to its second analog level $V_2$ less than or equal to supply voltage $V_{DD}$ but higher than threshold voltage $V_{TH}$. During exposure, signal TI is always kept at its low level. The charge carriers produced by photodiode PD are thus transferred entirely, during the exposure phase, to memory node B, provided that the potential of memory node B has not reached the level of the potential barrier defined by transistor M2. Given that these charge carriers only "see" the capacitance of memory node B, they generate a more significant voltage variation. Via this mechanism, the pixel sensitivity is thus increased.

At instant t2, signal RST is brought to the low logic level in order to uncouple the memory node B from supply voltage $V_{DD}$ and signal TI is simultaneously brought to a high logic level (at least higher than the gate voltage applied to transistor M2) in order to interrupt the pixel exposure, or more exactly, the accumulation of charge carriers produced by photodiode PD. When signal TI is at the high level, the charge carriers produced by photodiode PD are drained via transistor M1 and the measuring signal is stored on memory node B. In a way, transistor M1 controlled by signal TI plays the role here of shutter control similar to the function which was, until now, fulfilled by transistor M2.

It will be noted that one may perfectly well envisage switching signal SH applied to transistor M2 to a low logic level in order to uncouple nodes A and B in accordance with the foregoing. However, as already mentioned, it is preferable to switch transistor M1 so that the charge carriers produced by photodiode PD are drained via this transistor in order to avoid disturbing the measuring signal stored on memory node B. According to the preferred variant illustrated, by controlling transistor M1 in this way, advantage is thereby taken of the potential barrier generated by voltage $V_{INT}$ applied to the gate terminal of transistor M2 to perform the uncoupling.

The read operation is undertaken as soon as signal TI is brought to the high logic level and is followed by signal TI passing again to its low level again (instant t3) then (instant t4) signal RST passing to its first analog level $V_1$ again. The process is then repeated in accordance with the chronology listed hereinbefore.

Figure 9B:
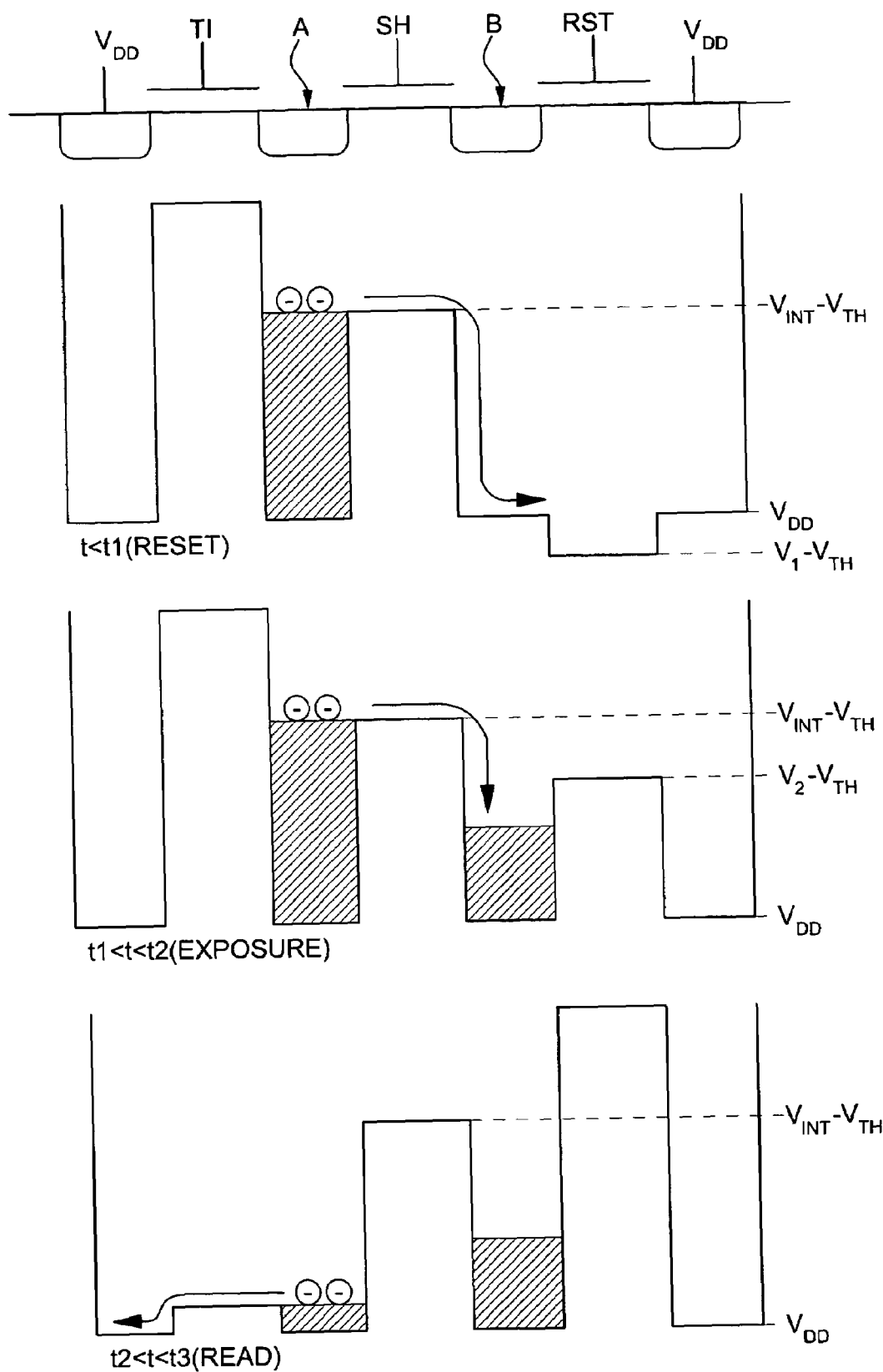

FIG. 9b illustrates schematically the level of the potentials defined by the voltages applied to the gate terminals of transistors M1, M2 and M3 during the initialisation, exposure and read phases.

Thus, during the initialisation phase (0<t<t1), nodes A and B are respectively initialised at voltages substantially equal to $V_{INT}-V_{TH}$ and $V_{DD}$. During the exposure phase (t1<t<t2), the charge carriers produced by photodiode PD at node A are entirely transferred to memory node B and accumulate there. In a similar manner to that previously described, the pixel response is first of all linear then logarithmic if the illumination is such that the voltage of memory node B decreases and becomes lower than the gate voltage of transistor M3, the latter then entering weak inversion mode. During the read phase (t2<t<t3), the charge carriers produced by photodiode PD are drained via transistor M1 and the transfer of these charges to memory node B is interrupted, the memory node being also uncoupled from supply voltage $V_{DD}$ by transistor M3.

In the various variants which have been presented above, the read operation can be achieved in accordance with a technique known to those skilled in the art as "Correlated Double Sampling" or CDS. According to this known technique, the read operation of each line is broken down into a first read phase of the voltage present on memory nodes B of the pixels in a line followed by a second read phase during which the memory nodes of the pixels in the line are reinitialised, normally by means of transistor M3. A signal formed of the difference between the measured sampled voltage and the initialisation voltage of the memory node is then produced for each pixel. This technique allows fixed pattern noise to be removed, i.e. the noise present at each pixel of the sensor which is due to the slight differences in sensitivity which can exist between the pixels. Both the line selection signal RSEL and the second initialisation signal RST are thus applied line by line during this read phase.

It should be noted that the variants presented utilise either transistor M1 or transistor M3 (designated the "first transistor" in the claims) to generate an at least partially logarithmic response. The other transistor, i.e. the transistor which is not operated in weak inversion mode, may not be necessary. Thus, the variant of FIG. 5a does not necessarily require the presence of transistor M3. Likewise, transistor M1 in the variants of FIGS. 5c and 6b is not strictly necessary. The present invention can thus be applied to any type of pixel structure having a global architecture like that illustrated in FIG. 2a and which includes at least one transistor connected, directly or indirectly, to the photo-sensor element, i.e. a transistor whose drain terminal is connected to a determined voltage (for example supply voltage $V_{DD}$) and whose source terminal is connected either to node A of the pixel (a first terminal of coupling transistor M2) or to node B of the pixel (the second terminal of coupling transistor M2). The pixel structure of FIG. 2b is however particularly advantageous since it offers great flexibility of use as is apparent from the various variants presented hereinbefore.

By way of improvement against the phenomenon of charge carrier diffusion in the substrate, it is preferable to use n-well type photodiodes i.e. photodiodes formed in n type wells. This structure has the advantage of forming a better obstacle to charge carrier diffusion than a photodiode structure conventionally formed, for example of a simple n type diffusion region.

Numerous modifications and/or improvements to the present invention can be envisaged without departing from the scope of the invention defined by the annexed claims. In particular, the pixel structure used by way of example to illustrate the process according to the present invention could in principle be achieved by means of a complementary p-MOS technology or, if required, include additional transistors. It will be understood for example, that sampling transistor M2 essentially has the role of uncoupling the photodiode and the memory node of the pixel and that other arrangements may be provided to fulfil this function.

The invention claimed is:

1. A method for operating a CMOS image sensor including a plurality of pixels, each of said pixels including a photo-sensor element producing charge carriers in proportion to its illumination and storage means capable of being coupled to and uncoupled from said photo-sensor element at a determined instant in order to store, on a memory node of said pixel, a measuring signal representative of said charge carriers produced by said photo-sensor element during an exposure phase, each pixel including:
a first MOS transistor connected in series via its drain and source terminals, on the one hand, to a supply voltage and, on the other hand, directly to said photo-sensor element, a gate terminal of said first MOS transistor being controlled by a control signal,
coupling means including first and second terminals for coupling and uncoupling said photo-sensor element and said storage means, said coupling means being a MOS coupling transistor including gate, source and drain terminals, said source and drain terminals of this coupling transistor being respectively connected to said photo-sensor element and said memory node,
a second MOS transistor connected in series via its drain and source terminals, on the one hand, to a supply voltage and, on the other hand, directly to said storage means and indirectly to said photo-sensor element via said coupling means,
the first and second terminals of the coupling means being respectively connected to the source terminal of the first MOS transistor and to the source terminal of the second MOS transistor; and
reading means composed of a third transistor, as a source follower transistor, whose gate is connected directly to said storage means, and a fourth transistor as a line selection transistor,
wherein said first or second MOS transistor is operated at least partially in weak inversion so that, during the exposure phase of said photo-sensor element, the pixel has at least partially a logarithmic response for illumination levels higher than a determined illumination level which can be zero.

2. A method for operating a CMOS image sensor including a plurality of pixels, each of said pixels including a photo-sensor element producing charge carriers in proportion to its illumination and storage means capable of being coupled to and uncoupled from said photo-sensor element at a determined instant in order to store, on a memory node of said pixel, a measuring signal representative of said charge carriers produced by said photo-sensor element during an exposure phase, each pixel including:
a first MOS transistor connected in series via its drain and source terminals, on the one hand, to a supply voltage and, on the other hand, directly to said photo-sensor element, said photo-sensor element being connected, on the one hand, to a first supply voltage and, on the other hand, to the source terminal of said first MOS transistor;
coupling means including first and second terminals for coupling and uncoupling said photo-sensor element and said storage means;
a second MOS transistor connected in series via its drain and source terminals, on the one hand, to a supply voltage and, on the other hand, directly to said storage means and indirectly to said photo-sensor element via said coupling means,
the first and second terminals of the coupling means being respectively connected to the source terminal of the first MOS transistor and to the source terminal of the second MOS transistor; and
reading means composed of a third transistor, as a source follower transistor, whose gate is connected directly to said storage means, and a fourth transistor as a line selection transistor,
wherein said first or second MOS transistor is operated at least partially in weak inversion so that, during the exposure phase of said photo-sensor element, the pixel has at least partially a logarithmic response for illumination levels higher than a determined illumination level which can be zero, and
wherein a selected one of said first and second MOS transistors is operated by switching the gate terminal of the said selected transistor between a first voltage during an initialisation phase and a second voltage during the exposure phase,
said first voltage being higher than the supply voltage applied on the drain terminal of the selected transistor plus the threshold voltage of the selected transistor,
said second voltage being lower than or equal to the supply voltage applied on the drain terminal of the selected transistor, but higher than said first supply voltage.

3. The method according to claim 2, wherein said first MOS transistor is operated so that said pixel has a combined linear-logarithmic response during the exposure phase, said method including the following steps:
a) an initialisation step consisting in applying said first voltage to the gate terminal of said first MOS transistor, said photo-sensor element and said storage means being uncoupled from each other by means of said coupling means;
b) an exposure step of determined duration, consisting in applying said second voltage to the gate terminal of said first MOS transistor, said photo-sensor element and said storage means being uncoupled from each other by means of said coupling means;
c) a storage step consisting in briefly coupling said photo-sensor element and said storage means via said coupling means in order to store said measuring signal on said memory node; and
d) a read step consisting in reading said measuring signal stored on said memory node.

4. The method according to claim 3, wherein the storage step is preceded by an initialisation step consisting in initialising said memory node at a determined initialisation voltage by means of said second MOS transistor.

5. The method according to claim 2, wherein said second MOS transistor is operated so that said pixel has a combined linear-logarithmic response during the exposure phase, said method including the following steps:
a) an initialisation step consisting in applying said first voltage to the gate terminal of said second MOS transistor, said photo-sensor element and said storage means being coupled to each other via said coupling means;
b) an exposure step of determined duration, consisting in applying said second voltage to the gate terminal of said second MOS transistor, said photo-sensor element and said storage means being coupled to each other via said coupling means;

c) a storage step consisting in uncoupling said photo-sensor element and said storage means and applying a voltage to the gate terminal of the second MOS transistor so that said transistor is non-conductive, thereby storing said measuring signal on said memory node; and
d) a read step consisting in reading said measuring signal stored on said memory node.

6. The method according to claim 5, wherein said coupling means is a MOS coupling transistor including gate, source and drain terminals, said source and drain terminals of this coupling transistor being respectively connected to said photo-sensor element and said memory node,
and wherein the gate terminal of said coupling transistor is kept, at least during the initialisation step a) and exposure step b), at a lower voltage than the second voltage applied to the gate terminal of said second MOS transistor during the exposure step.

7. The method according to claim 5, wherein during said read step, a voltage is applied to the gate terminal of the first MOS transistor such that the charge carriers produced by said photo-sensor element are drained via said first MOS transistor.

8. The method according to claim 2, wherein said photo-sensor element is connected, on the one hand, to a first supply voltage and, on the other hand, to the source terminal of said first MOS transistor,
and wherein a selected one of said first and second MOS transistors is operated by connecting the said selected transistor in a resistor configuration during the exposure phase and by initialising the source terminal of the selected transistor by means of the other one of said first and second MOS transistors, prior to the exposure phase, at a determined initialisation voltage higher than the supply voltage applied on the drain terminal of the selected transistor.

9. The method according to claim 8, wherein said first MOS transistor is operated so that said pixel has a combined linear-logarithmic response during the exposure phase,
wherein the drain terminal of the second MOS transistor is connected to a supply voltage which is higher than the supply voltage applied on the drain terminal of the first MOS transistor,
and wherein said first MOS transistor is connected in a resistor configuration by connecting its gate terminal to the supply voltage applied on its drain terminal,
the method including the following steps:
a) an initialisation step consisting in coupling said photo-sensor element and said storage means via said coupling means and in making said second MOS transistor conductive to initialise the source terminal of said first MOS transistor at the determined initialisation voltage;
b) an exposure step of determined duration, consisting in making said second MOS transistor non conductive and in keeping said photo-sensor element and said storage means coupled;
c) a storage step consisting in uncoupling said photo-sensor element and said storage means and in keeping said second MOS transistor in the non conductive state, thereby storing said measuring signal on said memory node; and
d) a read step consisting in reading said measuring signal stored on said memory node.

10. The method according to claim 8, wherein said second MOS transistor is operated so that said pixel has a combined linear-logarithmic response during the exposure phase, wherein the drain terminal of said first MOS transistor is connected to a supply voltage which is higher than the supply voltage applied on the drain terminal of the second MOS transistor, and wherein said second MOS transistor is connected in a resistor configuration by connecting its gate terminal to the supply voltage applied on its drain terminal, the method including the following steps:

a) an initialisation step consisting in coupling said photo-sensor element and said storage means via said coupling means and in making said first MOS transistor conductive to initialise the source terminal of said second MOS transistor at the determined initialisation voltage;

b) an exposure step of determined duration, consisting in making said first MOS transistor non conductive and in keeping said photo-sensor element and said storage means coupled;

c) a storage step consisting in uncoupling said photo-sensor element and said storage means and in keeping said first MOS transistor in the non conductive state and in making said second MOS transistor non-conductive, thereby storing said measuring signal on said memory node; and d) a read step consisting in reading said measuring signal stored on said memory node.

11. The method according to claim 2, wherein said first MOS transistor is operated so that said pixel has a logarithmic response during the exposure phase, said method including the following steps:

a) an exposure step consisting in connecting said first MOS transistor in a resistor configuration by connecting its gate terminal to the supply voltage applied to its drain terminal, said photo-sensor element and said storage means being uncoupled from each other by means of said coupling means;

b) an initialisation step consisting in initialising said memory node at a determined initialisation voltage via said second MOS transistor;

c) a storage step consisting in briefly coupling said photo-sensor element and said storage means via said coupling means in order to store said measuring signal on said memory node; and d) a read step consisting in reading said measuring signal stored on said memory node.

12. The method according to claim 2, wherein said second MOS transistor is operated so that said pixel has a logarithmic response during the exposure phase, said method including the following steps:

a) an exposure step consisting in connecting said second MOS transistor in a resistor configuration by connecting its gate terminal to the supply voltage applied on its drain terminal, said photo-sensor element and said storage means being coupled to each other by means of said coupling means;

b) a storage step consisting in uncoupling said photo-sensor element and said storage means and applying a voltage to the gate terminal of the second MOS transistor so that said transistor is non-conductive, thereby storing said measuring signal on said memory node; and c) a read step consisting in reading said measuring signal stored on said memory node while applying a voltage to the gate terminal of said first MOS transistor such that the charge carriers produced by said photo-sensor element are drained via said first MOS transistor.

13. The method according to claim 2, wherein each pixel includes a reverse biased photodiode forming said photo-sensor element and which is connected, on the one hand, to a first supply voltage and, on the other hand, to the first terminal of said coupling means and to the source terminal of said first MOS transistor.

14. The method according to claim 2, wherein said coupling means is a MOS transistor including gate, source and drain terminals, said source and drain terminals of said transistor being respectively connected to said photo-sensor element and to said memory node.

15. A CMOS image sensor including a plurality of pixels, each of said pixels including a photo-sensor element producing charge carriers in proportion to its illumination and storage means capable of being coupled to and uncoupled from said photo-sensor element at a determined instant in order to store, on said storage means, a measuring signal representative of said charge carriers produced by said photo-sensor element during an exposure phase, said photo-sensor element being connected, on the one hand, to a first supply voltage and, on the other hand, to the source terminal of said first MOS transistor, each pixel including:

a first MOS transistor connected in series via its drain and source terminals, on the one hand, to a supply voltage and, on the other hand, directly to said photo-sensor element;

coupling means including first and second terminals for coupling and uncoupling said photo-sensor element and said storage means;

a second MOS transistor connected in series via its drain and source terminals, on the one hand, to a supply voltage and, on the other hand, directly to said storage means and indirectly to said photo-sensor element via said coupling means, the first and second terminals of the coupling means being respectively connected to the source terminal of the first MOS transistor and to the source terminal of the second MOS transistor; and reading means composed of a third transistor, as a source follower transistor, whose the gate is connected directly to said storage means, and a fourth transistor as a line selection transistor, wherein said first or second MOS transistor is operated at least partially in weak inversion so that, during the exposure phase of said photo-sensor element, the pixel has at least partially a logarithmic response for illumination levels higher than a determined illumination level which can be zero, and wherein said sensor includes means for switching the gate voltage of a selected one of said first and second MOS transistors between a first voltage during an initialisation phase and a second voltage during the exposure phase, said first voltage being higher than the supply voltage applied on the drain terminal of the selected transistor plus the threshold voltage of the selected transistor, said second voltage being lower than or equal to the supply voltage applied on the drain terminal of the selected transistor, but higher than said first supply voltage.

16. The image sensor according to claim 15, wherein said photo-sensor element is connected, on the one hand, to a first supply voltage and, on the other hand, to the source terminal of said first MOS transistor,
- wherein a selected one of said first and second MOS transistors is connected in a resistor configuration during the exposure phase,
- and wherein the drain terminal of the other one of said first and second MOS transistors is connected to a supply voltage which is higher than the supply voltage applied on the drain terminal of the selected transistor,
- said other transistor forming initialisation means for initialising the source terminal of the said selected transistor at a determined voltage higher than the supply voltage applied on the drain terminal of the said selected transistor.

17. The image sensor according to claim 15, wherein each pixel includes a reverse biased photodiode forming said photo-sensor element and which is connected, on the one hand, to a first supply voltage and, on the other hand, to the first terminal of said coupling means and to the source terminal of said first MOS transistor.

18. The image sensor according to claim 17, wherein the photodiode is formed in an n-well and wherein said transistors are n-MOS transistors.

19. The image sensor according to claim 15, wherein said storage means is formed of a capacitor protected from light by a metal layer.

* * * * *